United States Patent [19]

Custer et al.

[11] Patent Number: 4,783,374

[45] Date of Patent: Nov. 8, 1988

[54] COATED ARTICLE AND METHOD OF MANUFACTURING THE ARTICLE

[75] Inventors: Russell C. Custer, Clawson; Arnold Register, Lake Orion; Annette Johncock, Highland; Stephen J. Hudgens, Southfield; Robert Burkhardt, Sterling Heights; Kevin Dean, Pontiac, all of Mich.

[73] Assignee: Ovonic Synthetic Materials Company, Troy, Mich.

[21] Appl. No.: 121,019

[22] Filed: Nov. 16, 1987

[51] Int. Cl.[4] .............................. B05D 3/06; B32B 7/16
[52] U.S. Cl. ...................................... 428/447; 428/450
[58] Field of Search ............... 428/441, 447, 450, 405; 528/32, 25

[56] References Cited

U.S. PATENT DOCUMENTS 4,465,738 8/1984 Chang .............................. 428/441 X
4,743,662 5/1988 Lipowitz .......................... 528/32 X Primary Examiner—Nancy Swisher
Attorney, Agent, or Firm—Richard M. Goldman; Marvin S. Siskind

[57] ABSTRACT

Disclosed is a coated article having a substrate with an adherent, abrasion resistant alkene-silane plasma reaction product coating. In a preferred exemplification the coating is substantially transparent to visible light and partially absorbing to ultraviolet light. The coating is a plasma assisted chemical vapor deposition deposited coating.

14 Claims, 10 Drawing Sheets

COATED ARTICLE AND METHOD OF MANUFACTURING THE ARTICLE

FIELD OF THE INVENTION

The invention relates to hard, adherent, transparent coatings, especially for soft metallic articles and transparent polymeric articles. The coatings are prepared by plasma assisted chemical vapor deposition of a gaseous silane, an unsaturated hydrocarbon gas, an oxygen source, and, optionally, saturated hydrocarbons, including aromatic hydrocarbons. The resulting coatings are characterized by a glass like hardness, and outstanding solvent resistance and thermal stability.

BACKGROUND OF THE INVENTION

Transparent organic polymeric articles, i.e., plastics are increasingly replacing glass in many applications. However, the low abrasion resistance of plastics has limited their full utilization. Attempts to remedy this limitation have included the use of hard coatings. Plastic objects having hard coatings find wide application. However, the full utilization of hard coated plastics has been limited by poor adhesion between the hard coating and the plastic substrate. Poor adhesion between the hard coating and the substrate has been identified with mismatches of, e.g., coefficient of thermal expansion, modulus of elasticity, lattice parameter, degree or extent of crystallinity, degree of crystallinity, and compositional and/or structural dissimilarity, between the substrate and the coating.

Even with poor adhesion, the applications of coated plastics are many and varied. One application is optical fibers. Hard coatings applied to the outside surfaces of optical fibers provide protection to plastic optical fibers.

Other applications of hard coated plastic optical elements are in mirrors for high energy lasers.

Plastic is also used as the refractive element in lenses, for example ophthalmic, and photographic, and telescopic lenses. Especially preferred are polycarbonate and polyallyl carbonate polymers for ophthalmic, sun glass, and safety goggle applications, and polymethyl methacrylate polymers for camera lenses, binocular lenses, telescope lenses, microscope objectives and the like. Plastic lenses have found good market acceptance and market penetration. However, the full potential of plastic lenses has been limited by their low resistance to abrasion hazing, and scratching. Prior art abrasion resistant coatings, deposited from solution and exemplified by polysilicate coatings and polysiloxane coatings, have not eliminated the problem of poor adhesion and poor abrasion resistance.

Plastic sheets with scratch and abrasion resistant coatings have found market acceptance in various automotive applications. These include headlight panels, sunroofs, side windows, and rear windows. However, the fuller utilization of coated plastic sheet material has been limited by various problems, including poor adhesion, mismatch of thermal expansion coefficients between the plastic and the coating, and poor solvent resistance.

Large area plastic sheets have also found utility in applications such as doors, windows, walls, air craft windows, air craft canopies, vandalism and break-in resistant panels, windows and doors, and esthetic barriers. However, the poor abrasion resistance of these large sheets limits their more complete acceptance.

Plastic materials have also been utilized to provide a shatter resistant layer for large sheets of glass. The glass-plastic structure is exemplified by bi-layer windshields having a single sheet of glass on the weather incident side of the windshield, and a polymeric film, for example a polyurethane film, adherent to the glass on the interior side. These bi-layer windshields have not found market acceptance because of the very poor adhesion resistance to scratching and abrasion of the internal, polyurethane coating.

The inability to provide an adherent, abrasion resistant, solvent resistant, thermally stable, substantially transparent coating has limited the full potential of the transparent plastics and other soft substrates.

Other materials which require a hard coating are semiconductors, e.g., photosensitive semiconductors. These semiconductors, utilized in, for example, imagers, photovoltaic cells, and electrophotographic drums, are subject to abrasion, scratching, and hazing. Photovoltaic cells are subject to these insults during manufacturing and service, while imagers and electrophotographic drums are subject to the scratching, scraping, and abrading effects of rough sliding documents. In the case of electrophotographic drums, these effects are exacerbated by submicron, particulate toners.

SUMMARY OF THE INVENTION

According to the invention disclosed herein, a glass hard coating may be deposited on plastic or other articles that are thermally degradeable at low temperature and the problem of poor adhesion is obviated. These heretofore mutually inconsistent goals are accomplished by a plasma assisted chemical vapor deposited coating having organic and inorganic moieties. The coating is deposited at temperatures low enough to avoid thermal degradation of the substrate from a feed stock containing silane, an unsaturated hydrocarbon, a source of oxygen, an optional saturated and/or aromatic hydrocarbon, and an optional inert carrier gas. We characterize the coating as the reaction product of the plasma phase reaction of a silane, an unsaturated hydrocarbon, and an oxygen source. This reaction product is characterized by an infrared signature including an Si—H stretch line at approximately 4.4 microns (2375 cm$^{-1}$) and an infrared line at approximately 11.6 microns (approximately 880 cm$^{-1}$) corresponding to an SiH$_2$ scissors bond, and a C=C bond. When the oxygen source is N$_2$O, or when nitrogen is otherwise present in the deposition gas and the coating, the infrared spectroscopic scan further may include a distinct N—H stretching line at approximately 2.96 microns (approximately 3380 cm$^{-1}$).

Thus, according to the invention, a coated article is provided having a thermally degradeable soft substrate, e.g., a transparent plastic substrate, with an abrasion resistant, adherent, coating. Preferably the coating is substantially transparent in the visible spectrum. The coating may be partially absorbing in the ultraviolet range of the spectrum. The coating is an adherent, chemically stable, thermally stable, abrasion resistant coating deposited onto the substrate by plasma assisted chemical vapor deposition from a precursor gas including at least an unsaturated hydrocarbon, a silane, and an oxygen source.

The coated articles may be ophthalmic lenses having adherent, abrasion resistant, substantially transparent coatings on polycarbonate or poly(allyl carbonate) substrates. The coated articles may be photographic lenses, binocular lenses, fiber optics, laser mirrors, goggles, microscope objectives and the like.

Alternatively, the plastic substrate may be a large area plastic sheet as a window, door, wall, or automotive sun roof insert having the above described coating. The coated articles are also useful as part of a bi-layer of glass, plastic, and the contemplated abrasion resistant coating. These plastic substrates have low thermal degradation temperatures, i.e., low melting temperatures, low thermal decomposition temperatures, and/or low softening temperatures, requiring that the vapor deposited coatings be deposited under conditions that avoid thermal degradation of the substrate.

According to a further exemplification, the coated articles may be semiconductors, e.g., photosensitive semiconductors, such as photovoltaic cells, imagers, and electrophotographic drums. These semiconductors have a layer of, e.g., amorphous silicon alloy, or indium tin oxide, with the herein contemplated coating.

The coated articles, e.g., the transparent coated articles, having an adherent, abrasion resistant, solvent resistant, thermally stable coatings, are prepared by placing the plastic substrate or the plastic surface of a glass-plastic bi-layer to be coated in a vacuum chamber. The chamber is pumped down to a low pressure, e.g., at or below a relative minimum of the Paschen curve for microwave plasma assisted chemical vapor deposition, and less then about 10 millitorrs for radio frequency plasma assisted chemical vapor deposition. The substrates may then be sputter etched, e.g., radio frequency or microwave sputter etched with an argon atmosphere or an argon/helium atmosphere. Thereafter a deposition gas is introduced into the vacuum chamber.

A deposition gas mixture of an oxygen containing gas (as $O_2$, $CO_2$, $N_2O$, water, alcohol, or the like), a silane (as $SiH_4$, $Si_2H_6$, $Si_3H_8$, a fluoro silane, as $SiH_{4-x}F_x$ where x is from 1 to 4, $Si_2H_{6-y}F_y$ where y is from 0 to 6, or $Si_3H_{8-z}F_z$ where z is from 0 to 8), and an unsaturated hydrocarbon, as an alkene, $R_1$—CH=CH—$R_2$, or an alkyne, $R_1$—C≡C—$R_2$ where $R_1$ and $R_2$ are independently chosen from H, $CH_3$, $C_2H_5$, $C_3H_7$, higher alkenes, —CH=CH—$R_1$, and aromatics, is introduced into the vacuum chamber optionally the deposition gas may also contain saturated hydrocarbons and/or aromatic hydrocarbons. The vacuum deposition chamber is maintained at a low pressure, e.g., in the case of a radio frequency plasma about 200-500 millitorr, and in the case of a microwave plasma, for example, less than 50 millitorrs and preferably less than 5 millitorrs and a plasma, as an rf or microwave plasma, is formed in contact with the substrate.

The resulting coating, having a thickness of up to 10 microns or more, is substantially transparent to light in the visible portion of the spectrum, having a transmissivity of at least about 89 percent integrated over the visible spectrum and preferably partially absorbing in the ultraviolet portion of the spectrum. The coating is adherent and abrasion resistant, having an abrasion resistance corresponding to (1) less than 5 to 10 percent haze after 600 strokes by the method of ASTM F-735-81 utilizing $Al_2O_3$; (2) less than 2 percent haze after 500 revolutions by the method of ASTM D-1044-82; and (3) less than 17 percent haze after ten pounds of falling sand by the method of ASTM D-673-70.

DESCRIPTION OF THE DRAWINGS

The coated article and the method of preparing the coated article may be understood by reference to the Figures.

DETAILED DESCRIPTION OF THE INVENTION

Figure 1:
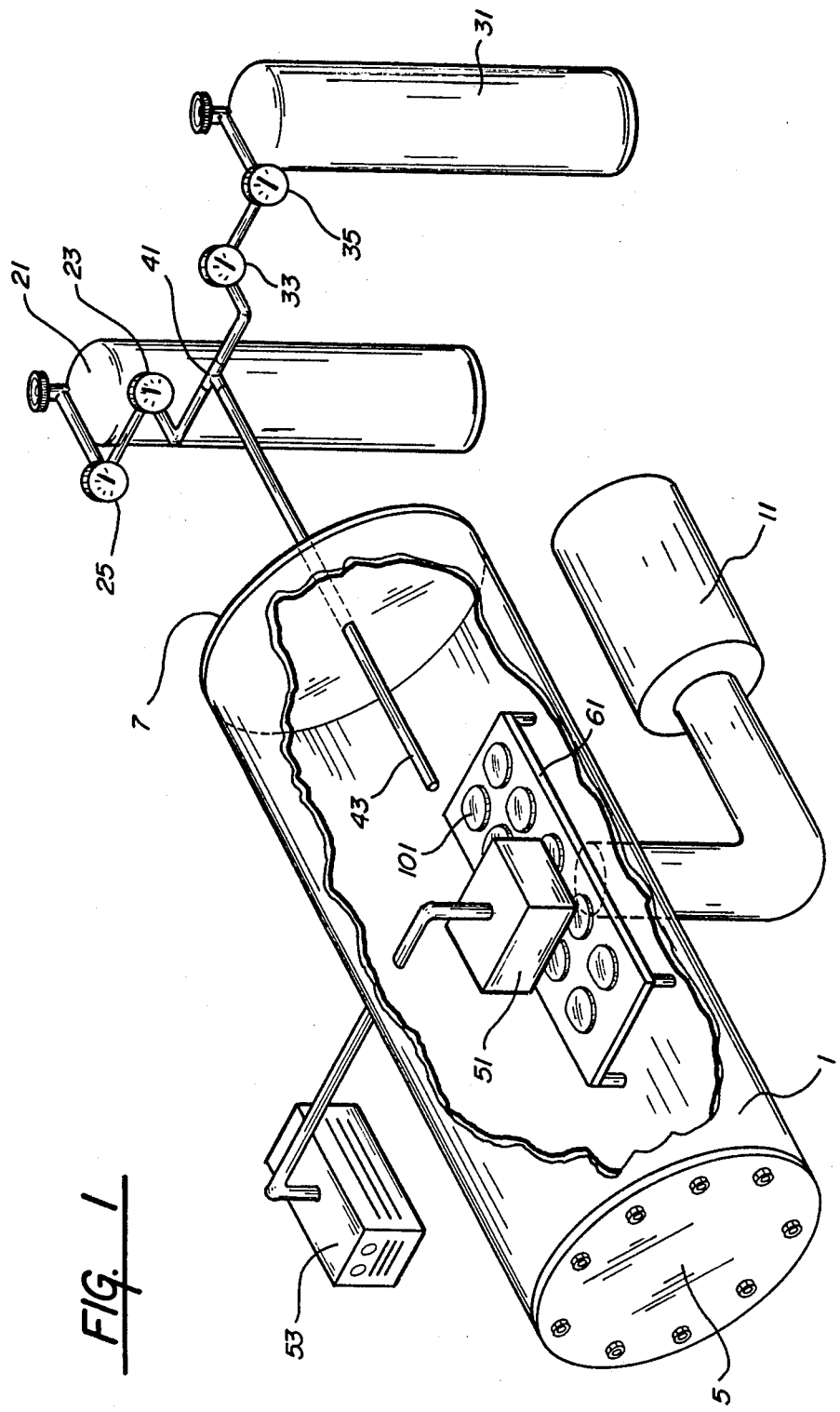
FIG. 1 is a partial phantom view of a microwave vacuum deposition system for applying the coating to the substrate.

According to the invention there is provided a coated article having a substrate which may be thermally degradeable at relatively low temperatures, e.g., below 200° C., e.g, a polymeric substrate or a semiconductor substrate, with an adherent, abrasion resistant, chemically resistant, thermally stable, optically transmissive, plasma reaction product coating thereon, deposited at controlled temperatures that are low enough to avoid thermal degradation of the substrate by plasma assisted chemical vapor deposition from a precursor gas of an unsaturated hydrocarbon, a silane, a source of oxygen, optionally, an inert gas, and optionally saturated and/or aromatic hydrocarbons.

The hard, plasma reaction coating is characterized by a unique infrared spectroscopy signature including (1) an Si—H bond stretch line approximately 4.4 microns (2375 cm$^{-1}$), (2) an Si—H$_2$ bond and/or a C=C stretch line at appoximately 11.6 microns (approximately 880 cm$^{-1}$), and (3) in coating prepared from a nitrogen containing gas, an N—H stretch line at approximately 2.9 microns (approximately 3380 cm$^{-1}$).

The hard coating is substantially colorless and transparent in the visible portion of the spectrum, and partially absorbing in the ultraviolet wave portion of the spectrum. That is, the light transmission is above about 87 percent when determined by the method of ASTM D-1003. The light transmission at 550 nanometers is above about 89 percent when determined using a spectrophotometer.

The plasma assisted chemical vapor deposition of the coating allows a hard, chemically resistant, relatively thick, but substantially colorless coating to be applied to a thermally degradeable substrate at controlled temperatures, e.g., below the thermal degradation temperature of the substrate. More particularly, the unsaturated hydrocarbon allows an especially adherent, glass hard coating to be deposited quickly at ambient temperatures without deformation decomposition, outgassing or other degradation of the substrate or delamination of the coating.

The coating is thick enough to be abrasion and impact resistant, and thin enough to be light transmissive. The coating is on the order of about 1 to about 10 microns or more thick and preferably from about 2 to about 5 microns thick. Alternatively, the thickness of the coating may be an odd quarter wave length to provide interference colors.

According to a particularly preferred exemplification the coating is a uniform coating, consisting essentially of an alkene-silane plasma reaction product having Si—O—, Si—C, Si—O—Si, and Si—O—C bonds, and formed by plasma assisted chemical vapor deposition from a reaction gas of a silane, an unsaturated hydrocarbon, and oxygen. When oxygen is referred to herein, it is to be understood that the oxygen may be introduced into the reaction gas as CO$_2$, N$_2$O, O$_2$ water or alcohol. It also to be understood that N—H and Si—F bonds may be detected when, e.g., nitrogen and fluorsilane, respectively, are present in the coating.

While the glass-hard coating may be prepared by any plasma assisted chemical vapor deposition process, radio frequency deposition and microwave deposition both offer advantages of operation.

A microwave deposition coating system is shown in FIG. 1. The deposition coating system includes a vacuum chamber 1, having end plates 5 and 7. The vacuum chamber 1 is evacuated by a vacuum pump 11. The vacuum chamber further includes means for feeding the reactive gas and inert gas, e.g. from tanks 21 and 31, through valves and regulators 23 and 25, and 33 and 35, to a fitting, for example "tee" fitting 41, and from the "tee" fitting 41 into the vacuum chamber through vacuum line 43. The deposition system further includes a microwave antenna, a microwave waveguide, or a microwave horn 51, and a microwave power supply 53. The microwave antenna 51 energizes the deposition gases, resulting in the formation of a plasma which then forms the coated articles 101.

Figure 2:
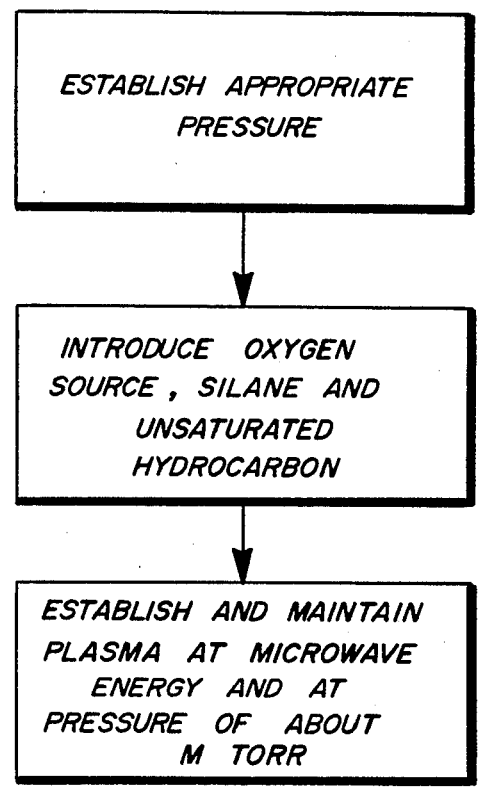
FIG. 2 is a flow chart of a microwave plasma assisted CVD method of forming the coated article of the invention.

A flow chart for a typical microwave process is shown in FIG. 2. At the low pressure utilized in microwave depositions, sputter etching may be utilized to prepare the substrate. Either a microwave sputter etch or an r.f. sputter etch can be used.

Next, the inert gas, an oxygen source, the unsaturated hydrocarbon, and the silane are introduced into the vacuum chamber 1. The composition of the gas mixture should be about 50 to 60 volume percent N$_2$O, 25 to 35 volume percent argon, 5 to 15 volume percent silane, and 5 to 15 volume percent alkene, e.g., propylene. For a three cubic foot vacuum chamber 1 a gas flow rate of about 40 standard cubic centimeters per minute provides efficient gas utilization. The residence time of the gases is about 0.02 to about 0.10 seconds.

Figure 3:
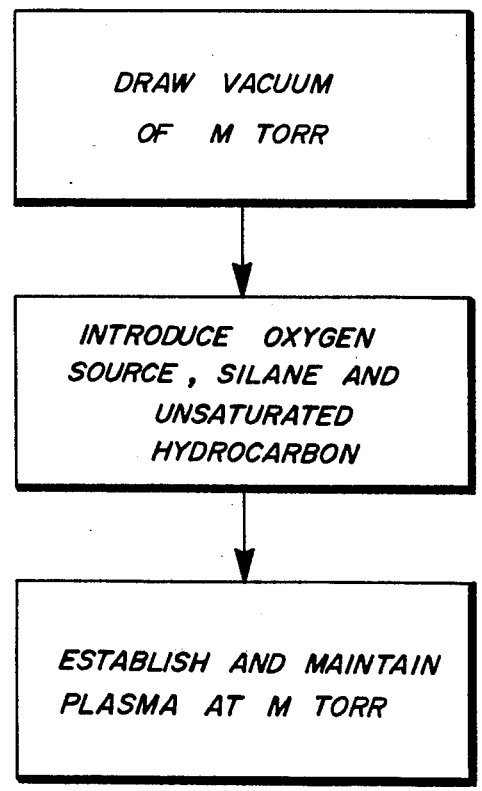
FIG. 3 is a flow chart of a radio frequency plasma assisted CVD method of forming the coated article of the invention.

A flow chart for a typical radio frequency plasma process is shown in FIG. 3. This flow chart shows the specific steps in the radio frequency plasma assisted chemical vapor deposition of the glass-hard coating. First an initial vacuum of about 10 millitorr to about 30 millitorr is established.

In this low pressure regime the substrate surface may be prepared, for example by sputter etching. The sputter etching may be carried out in an argon atmosphere at about 100 to 300 millitorr for 5 to 20 minutes.

Then, a feed stock gas of 50 to 60 atomic percent N$_2$O, 25 to 35 atomic percent argon, 5 to 15 atomic percent silane, and 5 to 15 atomic percent propylene. For a 8.6 cubic foot vacuum chamber, operated at 200 watts (0.6 watts per square inch of cathode area), and 200 millitorr pressure, a gas flow rate of 325 sccm (N$_2$O:175 sccm; Argon: 100 sccm; SiH$_4$:30 sccm; and C$_3$H$_6$:20 sccm) provides high process efficient gas utilization and a deposition rate of about 7 to 12 Angstroms per second.

The r.f. power determines various deposit properties, for example, lower power rating, e.g., less then 200 watts (0.6 watts per square inch of cathode area) provide less yellowness.

When a radio frequency energy source is used to form the plasma, the plasma is established and maintained at a relatively low energy and high pressure to provide initial adhesion without deformation of the plastic substrate 121,221. This power is generally on the order of about 50 to 200 or more watts. The pressure is from 100 to 500 millitorrs, and especially about 200 millitorrs.

The unsaturated hydrocarbon may be unsaturated, low molecular weight, hydrocarbon gas as ethylene, propylene, butene, or butadiene or even acetylene, or a higher molecular weight unsaturated hydrocarbon. Optionally, saturated hydrocarbons and/or aromatics may be present in the feed stock gas.

The silane is preferably a low molecular weight silane gas, for example monosilane, $SiH_4$, disilane $Si_2H_6$, of trisilane, $Si_3H_8$, or a fluorinated silane, as $SiH_{4-x}F_x$, where x is from 0 to 4, $Si_2H_{6-y}F_y$, where y is from 0 to 6, and $Si_3H_{6-z}F_z$, where z is from 0 to 8.

The oxidant for formation of the coating may be $O_2$, $CO_2$, $N_2O$ water, or alcohol (including unsaturated alcohol), with $N_2O$ preferred. Nitrogen ($N_2$) can also be sued as a carrier gas. The inert gas may be helium, neon, argon or krypton. Generally, for reasons of cost ad energy transfer efficiency, the inert gas is argon or helium, with argon preferred. Hydrogen may be incorporated into the gas stream.

While a radio frequency energy source is the conventional source of plasma excitation for many end users, it is to be understood that other energy sources, as microwave, may advantageously be employed to effect decomposition of the feed stock gas and deposition of the coating, at very high deposition rates.

While substantially equivalent results are obtained with both r.f. assisted plasmas and microwave assisted plasma, each energy source has a range of gas compositions, gas pressures, and energy densities that give a coating with the preferred properties.

Throughout the process of depositing the herein contemplated coating on a thermally sensitive substrate, it is necessary to maintain the substrate below either or both of: (1) the temperature where thermal degradation of the substrate may occur, and and (2) the time and temperature exposure where thermal degradation of the substrate may occur. Thermal degradation includes melting, softening, deformation, deleterious phase changes and transformations, decomposition, depolymerization, outgassing, and the like.

According to a particularly preferred exemplification of the invention a 3 inch $\times$ 3 inch $\times \frac{1}{8}$ inch polycarbonate coupon is placed in a vacuum chamber. The vacuum chamber is drawn down to a vacuum of about 100 to about 500 millitorrs. An argon-propylene-silane-$N_2O$ mixture is introduced into the vacuum chamber at a flow rate of about 325 standard cubic centimeters per minute. The radio frequency electrode is energized at an energy of about 50 to 200 watts to establish and maintain a plasma. Power is maintained between 50 to 200 watts for a long enough time to build up a coating of about 1 to about 10 microns and preferably for about 2 to about 5 microns.

Figure 4:
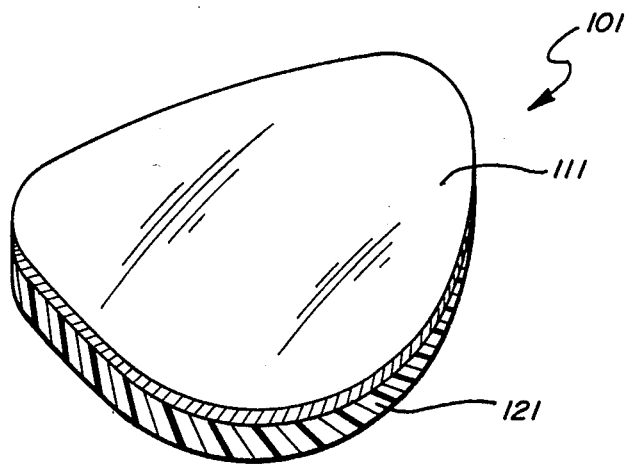
FIG. 4 is a partial isometric view, not to scale, of a coated plastic lens.
Figure 5:
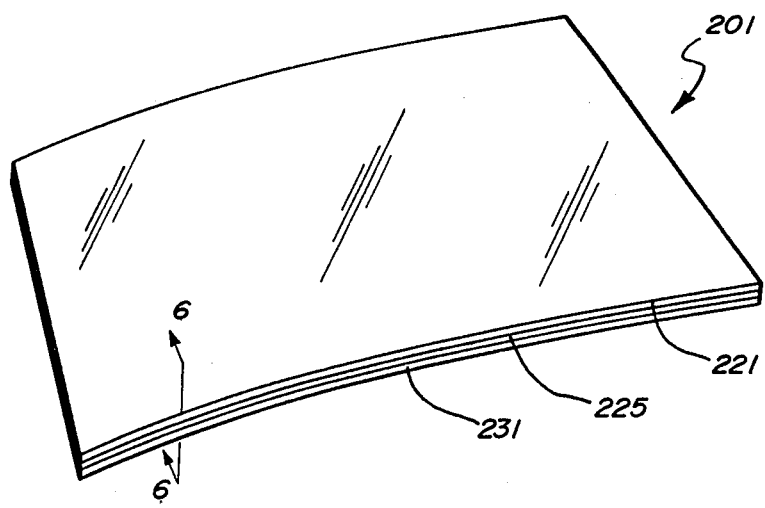
FIG. 5 is a partial isometric view of a bi-layer windshield having the hard coating on the exposed surface of the plastic.
Figure 6:
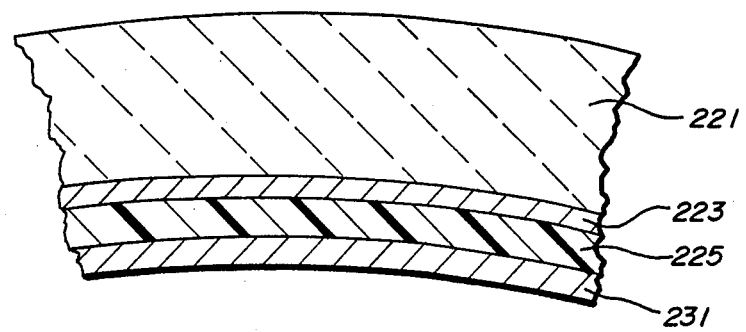
FIG. 6 is a partial cutaway view through cutting plane 6—6' of the windshield of FIG. 5 showing the glass substrate, the polyvinyl alcohol adhesive, the polyurethane bi-layer, and the hard coating.

FIG. 4 shows an ophthalmic lens 101 having a plastic substrate 121. The plastic substrate may be a polycarbonate a polyacrylate, such as poly(methyl methacrylates) poly(acrylates), poly(esters) or poly(allyl carbonate) such as PPG Industries "CR-39" ® diethylene glycol bis (allyl carbonate), polymerized with a suitable peroxide initiator to form a hard, substantially light transmissive polymer.

The coating 111 is generally from about 1 to about 10 microns thick and particularly from about 2 to about 5 microns thick. The coating comprises a region, film, segment, layer or entire coating of a plasma decomposition and deposition product of (1) an unsaturated hydrocarbon, (2) silane, and (3) an oxygen source as $O_2$ or $N_2O$. This region, film, segment, or layer encompasses a plasma reaction product of an alkene or alkenes, and a silane or silanes, formed in the presence of a plasma, from a feed stock gas comprising at least a silane or silanes, an alkene or alkenes, and a source of oxygen. Optionally the feed stock gas may contain saturated hydrocarbons, aromatic hydrocarbons, an inert carrier gas or gases, and hydrogen. The coating has —Si—O, —Si—O—C—, and —Si—O—Si— bonds.

The plastic substrate can be a plastic optical fiber, or laser mirror, or a plastic sheet, as a door, window, sun roof insert, or the like.

According to a further exemplification of the invention the coated article may be a glass-plastic laminate having the contemplated hard coating on the surface of the plastic remote from the glass and unprotected from the environment. Exemplary is a windshield 201 as shown in FIG. 3 and 4. However the article could be a window, a storm door glazing unit, or a sliding door glazing unit.

The windshield 201 includes a glass substrate 221 with a thin adhesive layer 223 of, for example, polyvinyl alcohol, and a plastic film 225, for example a substantially water white polyurethane. The hard coating 231 is on the unprotected surface of the plastic layer 225. This results in a significant reduction ih abrasion and scratching of the plastic 225.

According to a still further exemplification of the invention, the coating can be applied to metallic substrate, for example soft metallic substrates, such as the metal films on magnetic recording tape, magnetic recording disks, optical disks, and decorative metallic coatings. Thus, the coating may be used as a transparent, protective coating over decorative thin films, titanium nitride thin films on jewelry. Alternatively, the coatings herein contemplated may be applied atop magneto-optic, phase-change, and magnetic thin films, such as are used in data storage devices.

In a particularly referred exemplification the coating is applied to a magnetic film on a polymeric tape, such as would be used on a smart credit card or automatic teller machine card. These cards, frequently carried in abrasive contact with other cards, are highly subject to the effects of such abrasion and rubbing. As a result of the abrasion the magnetic strip becomes unable to provide its card holder verification function. The herein described coating protects the strip from abrasion without interfering with the magnetic properties thereof.

The invention may be understood by reference to the following examples and comparative tests.

EXAMPLE I

A series of tests were conducted to compare a poly(-carbonate) coupon having the novel coating of this invention with an uncoated poly(carbonate) coupon, an uncoated poly(methyl methacrylate) coupon, a poly(-carbonate) coupon having a commercial coating of the prior art, a poly(methyl methacrylate) coupon having a commercial coating of the prior art, and a float glass coupon.

The coupons were tested following the procedures of ASTM Standard D-673-70, D-1044-82, and modified F-735-8r (utilizing $Al_2O_3$.

Coupons of polycarbonate, were coated with a plasma assisted chemical vapor deposition copolymer of propylene and silane from a feed stock gas of propylene, silane, $N_2O$, and argon. Each coupon was coated by being placed in a vacuum chamber. The feed stock gas to the vacuum chamber contained 175 sccm of $N_2O$, 100 sccm of argon, 30 sccm of $SiH_4$, and 20 sccm of $C_3H_6$. The chamber was maintained at a pressure of 200 millitorr, and the r.f. electrode was energized at 200 watts. Deposition was continued for 155 minutes, until a coating thickness of 5-6 microns was obtained.

Figure 10:
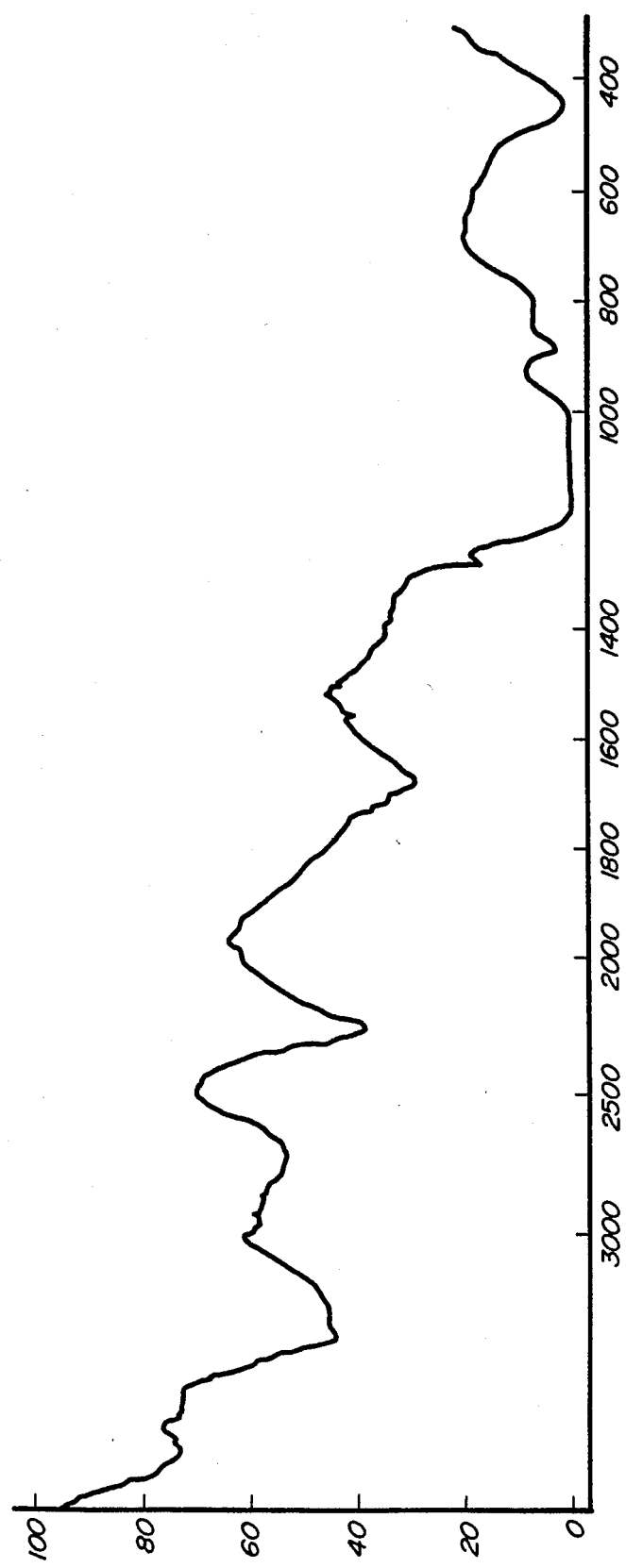
FIG. 10 is an infrared spectrum of a polycarbonate coupon with a coating of an alkene-silane plasma reaction product of the invention, produced by a radio frequency excited plasma, and showing unique spectroscopic features at 1.9 microns, 4.4 microns, and 11.6 micron.
Figure 11:
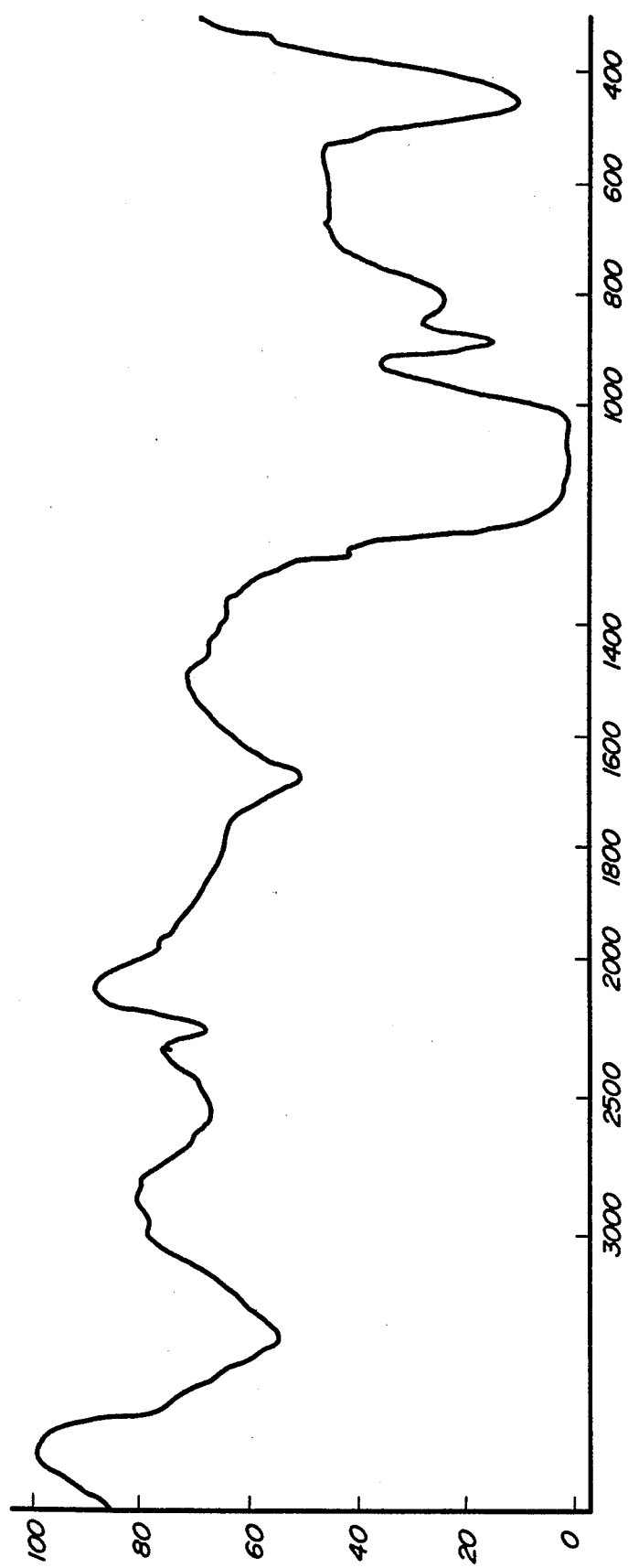
FIG. 11 is an infrared spectrum of a polycarbonate coupon with a coating of an alkene-silane plasma reaction product of the invention, also produced by a radio frequency excited plasma, and also showing the same features at 2.9 microns, 4.4 microns, and 11.6 microns as the sample shown in FIG. 10.

Samples coated by the method of the invention were examined by infrared spectroscopy, one sample, identified as Laboratory Sample LA282F, had the infrared spectrum reproduced in FIG. 10. To be noted is that the infrared spectrum show clear infrared lines at approximately 4.4 microns (wave number of approximately 2375 cm$^{-1}$), 11.6 microns (wave number of approximately 880 cm$^{-1}$), and, (wave number of approximately 3380 cm$^{-1}$). The infrared spectrum is shown in FIG. 10. The infrared spectrum of a similarly prepared sample is shown in FIG. 11. This sample confirms the spectrum of FIG. 10, with infrared lines at approximately 4.4 microns (wave number of approximately 2375 cm$^{-1}$), 11.6 microns (wave number of approximately 880 cm$^{-1}$), and 2.96 microns (wave number of approximately 880 cm$^{-1}$).

The infrared line at 4.4 microns is identified with stretching of the Si—H bond. The infrared line at 7.6 microns is identified with an SiH$_2$ structure and stretching of the C=C bond. The infrared line at 2.96 microns is identified with an N—H bond.

As a comparison, a polycarbonate coupon coated with General Electric MarGard ® was examined by x-ray spectroscopy. The x-ray specta did not show any features at 4.4 microns, 11.6 microns, or 2.96 microns. This very definitely shows that the coating of the invention is structurally different from the MarGard (®) coated polycarbonate material.

Figure 7:
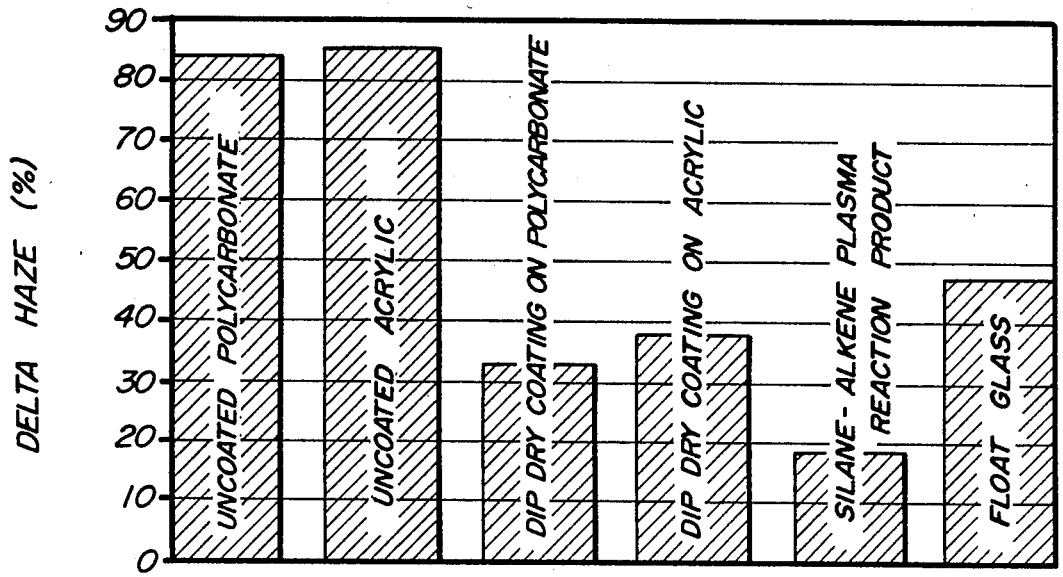
FIG. 7 shows a bar graph of the comparison of the increase in haze by the Falling Sand Test with SiC #80 by ASTM Standard D-673-70 for uncoated polycarbonate, uncoated poly(methyl methacrylate), float glass, two commercial coatings, and the copolymer coating of the invention.
Figure 8:
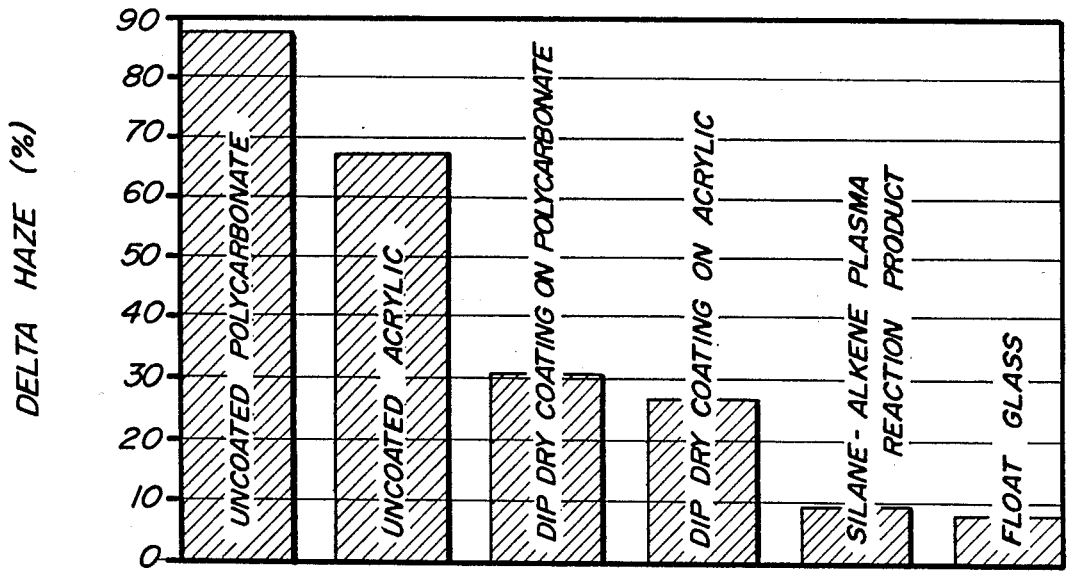
FIG. 8 is a bar graph of the comparison of the increase in haze by ASTM Standard F-735-81 for polycarbonate, poly(methyl methacrylate), two commercial coatings, float glass, and the copolymer coating of the invention.
Figure 9:
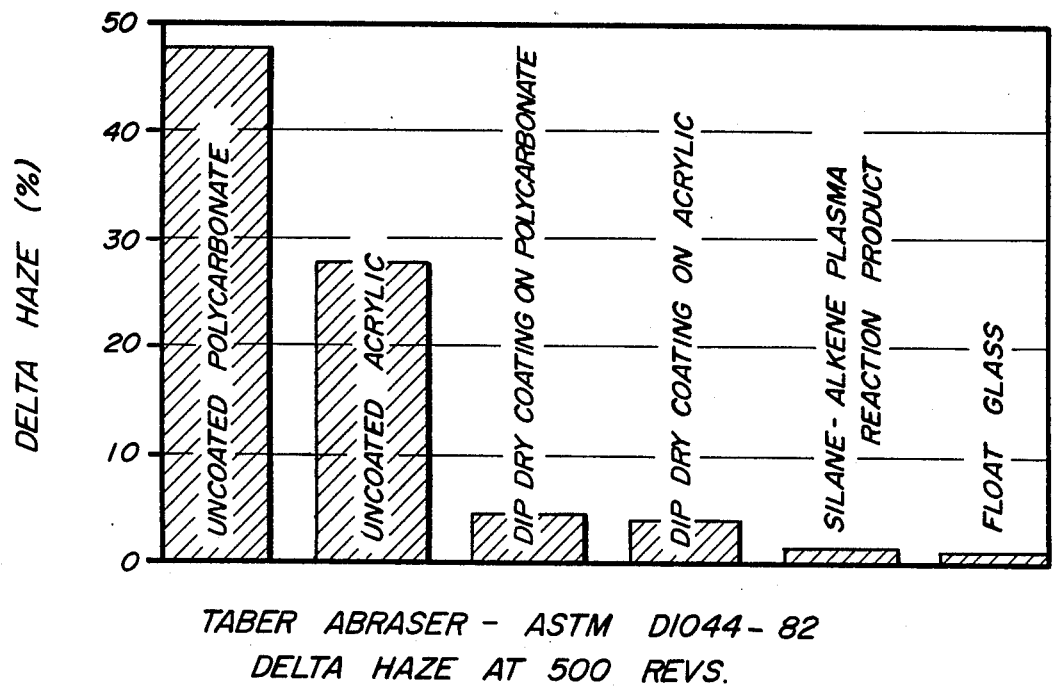
FIG. 9 shows a bar graph of the comparison of the increase in haze by ASTM Standard D-1044-82 (Taber Abrasion) for polycarbonate, poly(methyl methacrylate), two commercial coatings, float glass, and the copolymer coating of the invention.

The coated coupons were tested according to the Taber Abrasion Test (ASTM D-1044-82, FIG. 9), the Falling Sand Test (ASTM D-673-70, FIG. 8), and the Shaker Test (ASTM F-735-81, FIG. 7). As a comparison, uncoated polycarbonate, uncoated poly(methyl methacrylate), "MarGard" TM coated polycarbonate, "Acrivue" coated poly(methyl methacrylate), and float glass coupons were tested as comparisons. The results are shown in Table I, below.

These data clearly show that the coating of the invention is significantly more abrasion resistant then that of the prior art, and is, in fact, on a level with float glass.

sample, sample LBG897, deposition was continued until a coating thickness of 5 microns was obtained.

Figure 12:
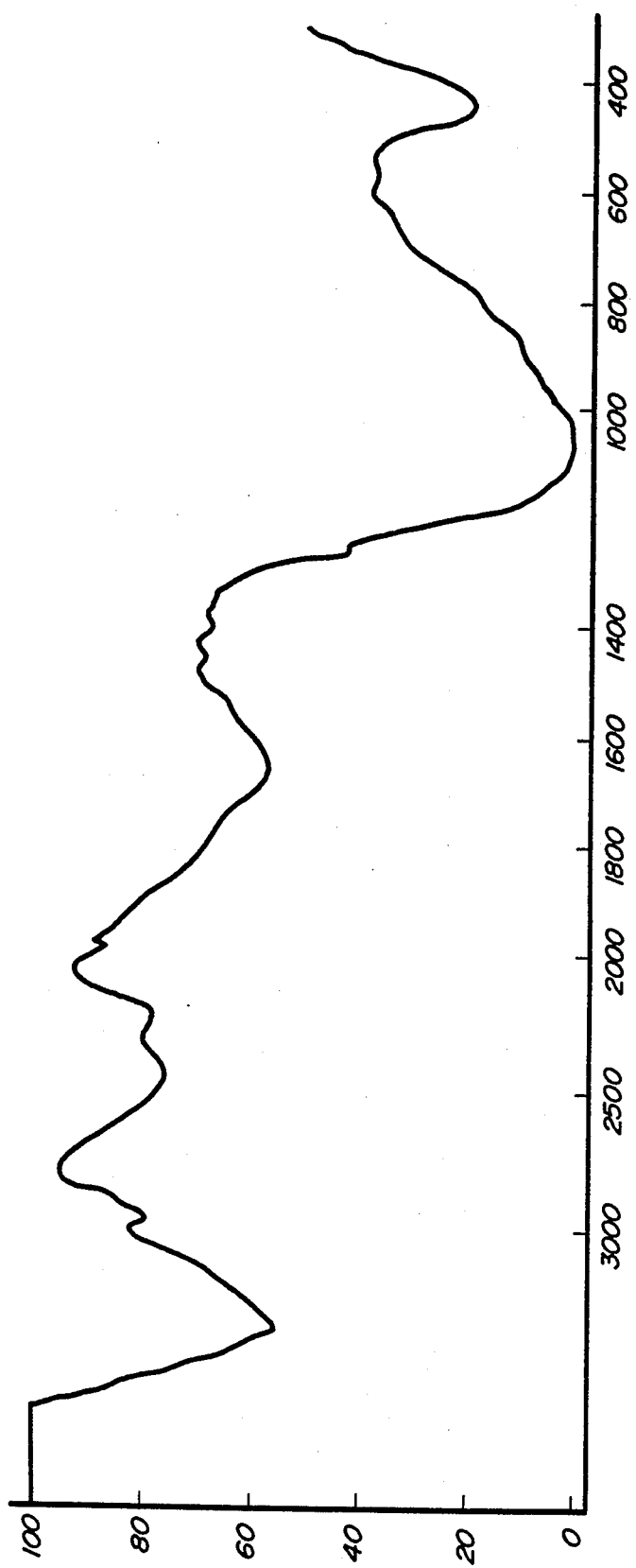
FIG. 12 is an infrared spectrum of a polycarbonate coupon with a coating of an alkene-silane plasma reaction product of the invention, produced by a microwave excited plasma, where the microwave energy was introduced through a microwave antenna. This sample also shows the same features at 2.9 microns, 4.4 microns, and 11.6 microns as the samples shown in FIGS. 10 and 11.
Figure 13:
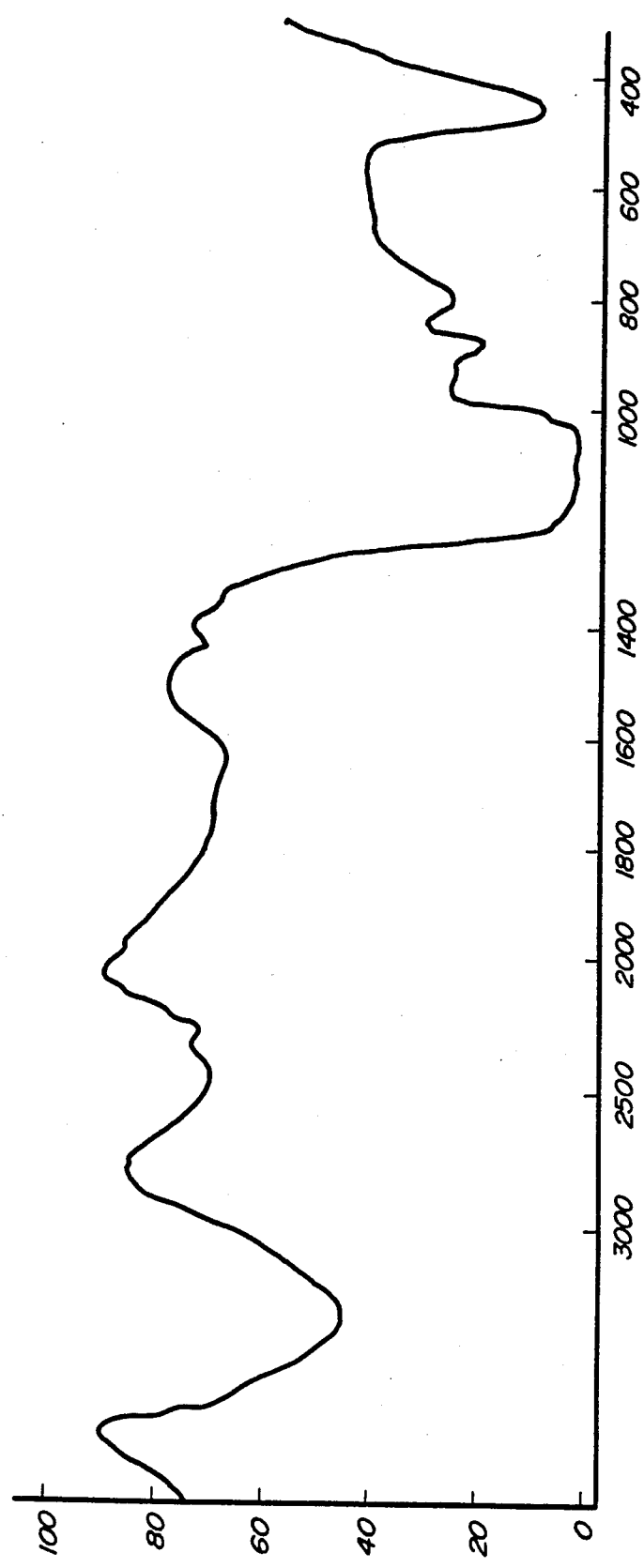
FIG. 13 is an infrared spectrum of a polycarbonate coupon with a coating an alkene-silane plasma reaction product of the invention, also produced by a microwave excited plasma. In this case the microwave energy was introduced through a microwave waveguide. Again, this sample shows substantially the same features at 2.9 microns, 4.4 microns, and 11.6 microns as the samples shown in FIG. 10, 11, 12, and 13.

This sample was then examined by IR spectroscopy. The IR spectrum of the sample is shown in FIG. 12. This sample also has the clear showings of N—H stretching at 2:96 microns (wave number of approximately 3380 cm$^{-1}$), Si—H stretching at approximately 4.4 microns (wave number of approximately 2375 cm$^{-1}$), and Si—H$_2$ bond stretching at approximately 11.6 microns (wave number of approximately 880 cm$^{-1}$).

As with the radio-frequency assisted plasma deposited material, these points are unique to the material of the invention, and are not shown in the MarGard ® coated sample.

EXAMPLE III

In another series of tests polycarbonate coupons were coated in a wave guide microwave plasma deposition system. The purpose of this series of tests was to demonstrate that the coatings of the invention are obtained by microwave deposition independent of the source of plasma excitation energy.

In this series of tests polycarbonate coupons were individually placed in a microwave vacuum deposition chamber equipped with a microwave wave guide. The chamber was flushed with an inert gas prior to deposition, and then argon was introduced. Next, the microwave waveguide was energized at 2000 watts for one minute in an argon plasma to heat and clean the polycarbonate substrate.

Thereafter, the pressure was increased to 5 millitorrs with a gas feed rate of 135 sccm of SiH$_4$, 220 sccm of N$_2$, 30 sccm of SiF$_4$, 5 sccm of C$_3$H$_5$, and 1125 sccm of CO$_2$. The microwave waveguide was energized with two 2 kilowatts microwave power supplies. The substrates were cooled by a cooling water heat exchanger plate beneath the substrate.

The resulting deposit was examined by infrared spectroscopy and showed clear evidence of N—H bond stretching at approximately 2.96 microns (wave number of approximately 3380 cm$^{-1}$), Si—H bond stretching at approximately 4.4 microns (wave number of approximately 2375 cm$^{-1}$), and Si—H bond stretching at ap-

| | WEAR TESTS - DELTA HAZE AFTER TEST | | | | | | |
|---|---|---|---|---|---|---|---|
| Test | Polycarbonate (%) | Acrylic (%) | MarGard (%) | Acrivue (%) | SAR (%) | Subject Invention (%) | Float Glass (%) |
| Taber Abraser ASTM D1044-82 500 Revs. | 48 | 28 | 4.5 | 3.9 | 3.8 | 1 | 0.7 |
| Falling Sand ASTM D673-70 10 lbs. | 83.8 | 85 | 32.6 | 37.5 | 47 | 15 | 46.7 |
| Shaker Test ASTM F735-81 Alumina used instead of Silica 600 strokes | 88 | 67 | 31 | 27 | 32 | 9 | 8 |

EXAMPLE II

A series of tests were run to determine the infrared spectra of coatings deposited by microwave excited plasmas. The purpose of this series of tests was to demonstrate that the coatings could be obtained by microwave deposition.

The pressure was 50 millitorr with a gas mixture containing 15 sccm of N$_2$O, and 0.5 sccm of C$_3$H$_6$. The antenna was energized at 105 watts. In the case of one proximately 11.6 microns (wave number approximately 880 cm$^{-1}$).

Figure 14:
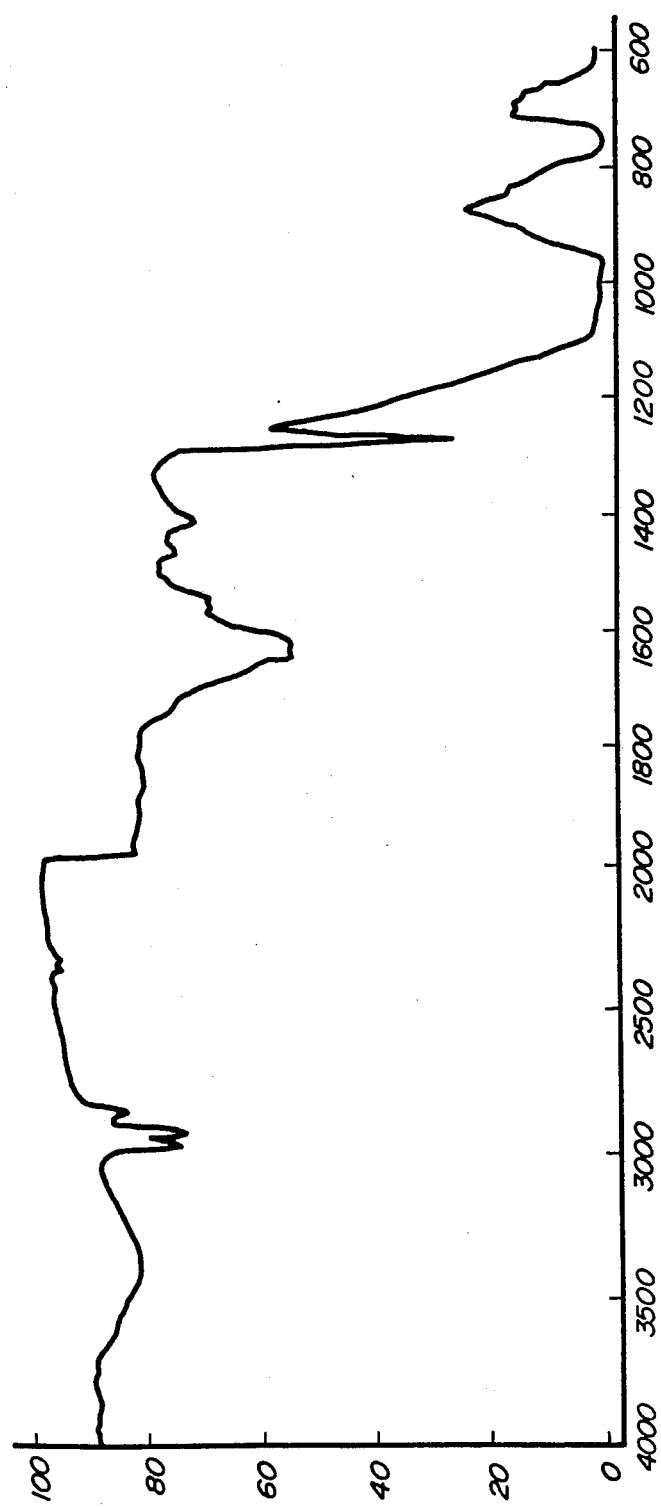
FIG. 14 is an infrared spectrum of a polycarbonate coupon with a General Electric MarGard ® coating. This sample does not show the features at 1.9 microns, 4.4 microns, and 11.6 microns that are present in the samples of the invention.

Comparison with the infrared spectroscopic spectrum of the General Electric MarGard ® coated product of FIG. 14 shown a very clear atomic structural difference, with the absence of these structural features in the General Electric MarGard ® product.

While the invention has been described with respect to certain claims and certain exemplifications thereof it is not intended to limit the scope of the invention thereby but solely by reference to the claims appended hereto.

We claim:

1. A coated article comprising:
   (a) a substrate; and
   (b) an adherent, abrasion resistant transparent coating thereon substantially amorphous and consisting essentially of a plasma assisted chemical vapor deposition deposited alkene-silane plasma reaction product of a silane, an alkene, and an oxygen source.

2. The coated article of claim 1 wherein the alkene-silane plasma reaction product is deposited from a feed stock gas comprising an unsaturated hydrocarbon.

3. The coated article of claim 1 wherein the coating has a transmissivity of 89 percent in the visible spectrum measured at a thickness of 2 to 5 microns.

4. The coated article of claim 1 wherein the coating has a transmissivity of 20 percent at a wavelength of 380 nanometers at a thickness of 2 to 5 microns.

5. The coated article of claim 1 wherein the coated article has a polymeric substrate.

6. The coated article of claim 5 wherein the substrate is a polymer chosen from the group consisting of polyacrylates, polycarbonates, poly(allyl carbonates), poly(acrylates), poly(ester), and polyurethanes.

7. The coated article of claim 1 wherein the coated article has a metallic substrate or semiconductor substrate.

8. The coated article of claim 1 wherein the coated article comprises a metallic tape on a plastic substrate.

9. The coated article of claim 8 wherein the metallic substrate is a magnetic medium.

10. The coated article of claim 7 wherein the metallic substrate is a soft metallic substrate.

11. The coated article of claim 7 wherein the semiconductor substrate comprising amorphous silicon.

12. The coated article of claim 1 wherein the substrate is a glass substrate.

13. The coated article of claim 12 wherein the deposition gas further comprises an inert gas.

14. The coated article of claim 1 wherein the coating is prepared by the method comprising:
    (a) providing a substrate to be coated in a vacuum chamber;
    (b) providing a deposition gas comprising at least one unsaturated hydrocarbon, at least one silane, and at least one oxygen source; and
    (c) forming and maintaining a plasma in contact with the substrate to decompose the gas and deposit a reaction product coating of the silane, the unsaturated hydrocarbon, and the oxygen source on the substrate.

* * * * *